(12) United States Patent
Hirota et al.

(10) Patent No.: US 7,223,480 B2
(45) Date of Patent: May 29, 2007

(54) METAL LAMINATE AND ETCHING METHOD THEREFOR

(75) Inventors: Koji Hirota, Sodegaura (JP); Masanao Kobayashi, Sodegaura (JP); Minehiro Mori, Sodegaura (JP); Naoki Nakazawa, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 206 days.

(21) Appl. No.: 10/500,846

(22) PCT Filed: Jul. 28, 2003

(86) PCT No.: PCT/JP03/09509

§ 371 (c)(1),
(2), (4) Date: Jul. 7, 2004

(87) PCT Pub. No.: WO2004/011247

PCT Pub. Date: Feb. 5, 2004

(65) Prior Publication Data

US 2005/0087509 A1    Apr. 28, 2005

(30) Foreign Application Priority Data

Jul. 29, 2002 (JP) .............................. 2002-220063
Nov. 1, 2002 (JP) .............................. 2002-319202

(51) Int. Cl.
*B32B 15/08* (2006.01)
*B32B 15/18* (2006.01)
*G11B 5/00* (2006.01)
*G11B 21/00* (2006.01)
*H01B 13/00* (2006.01)

(52) U.S. Cl. ................... 428/458; 428/336; 428/681; 216/13; 216/16; 216/67; 216/83; 360/128; 360/245.9

(58) Field of Classification Search ........... 428/607, 428/629, 632, 639, 681, 215, 336, 457, 458, 428/702; 216/13, 16, 67, 83, 95; 156/60, 156/182, 306.3; 360/75, 137, 128, 245.8, 360/245.9, 246.1, 234.6, 245.7, 244.3, 244.9, 360/244.2

See application file for complete search history.

(56) References Cited

U.S. PATENT DOCUMENTS 5,401,382 A * 3/1995 Katsuma .................. 205/171

| | | | |
|---|---|---|---|
| 2002/0027127 A1 | 3/2002 | Yagi et al. | |
| 2002/0155710 A1 | 10/2002 | Okamura et al. | |
| 2003/0085451 A1 | 5/2003 | Sakayori et al. | |
| 2004/0067349 A1 | 4/2004 | Okamura et al. | |
| 2004/0096676 A1 | 5/2004 | Sakayori et al. | |

FOREIGN PATENT DOCUMENTS

| | | | |
|---|---|---|---|
| JP | 2001-055570 A | | 2/2001 |
| JP | 2002-25027 A | | 1/2002 |
| JP | 2002-240193 A | | 8/2002 |
| JP | 2002-240194 A | | 8/2002 |
| JP | 2002-245609 A | | 8/2002 |
| JP | 2002-246708 | * | 8/2002 |
| JP | 2002-246708 A | | 8/2002 |

* cited by examiner

*Primary Examiner*—Michael E. LaVilla
(74) *Attorney, Agent, or Firm*—Buchanan, Ingersoll & Rooney PC

(57) ABSTRACT

The present invention relates to a metal laminate which is broadly used for a flexible wiring board or the like and an etching method therefor. In particular, the present invention relates to a metal laminate which includes a layer obtained by laminating a metal layer and an insulating layer, where the insulating layer is subjected to an etching process, wherein, in a surface of the metal layer which is positioned so as to come in contact with the insulating layer, respective concentrations of main metal element and oxygen element constituting the metal layer are measured from the surface of the metal layer towards inside of the metal layer in a time-elapsing manner according to AES (Auger electron spectroscopy) and a value of the thickness of a metal oxide film of the surface of the metal layer measured at a time when atomic concentrations of the main metal element and the oxygen element constituting the metal layer become equal to each other is in a range of at least 0 Å to less than 50 Å.

According to the present invention, an etching time of polyimide in the polyimide metal laminate can be calculated and a flexure used for a suspension for a hard disc drive having a high productivity can be provided.

21 Claims, No Drawings

METAL LAMINATE AND ETCHING METHOD THEREFOR

TECHNICAL FIELD

The present invention relates to a metal laminate which is broadly used for a flexible wiring board or the like and an etching method therefor. In particular, the invention relates to a metal laminate where an insulating layer is excellent in etching property and which is suitable for a high density circuit board material, and an etching method therefor.

RELATED BACKGROUND ART

Conventionally, for a flexure used for a suspension for a hard disc, a polyimide metal laminate mainly comprising copper alloy/polyimide/SUS304 is used. Particularly, according to capacity increase and densification in a hard disc in recent years, an amount of suspension use is increasing. Therefore, in order to improve production efficiency, suspension processing makers have endeavored to achieve a high efficiency in each manufacturing step.

However, in case that the above-described polyimide metal laminate is used, there occurs such a problem that, in a step that polyimide is etched after SUS 304 developing a suspension function has been etched with aqueous solution of ferric oxide, when a polyimide etching is performed, an etching rate varies for each lot of SUS304. For this reason, in order to realize a secure polyimide etching, a polyimide etching over a long term is required, which prevents a high efficiency from being attained.

As etching of polyimide, there are a method employing a dry etching where etching is conducted using plasma gas such as $NF_3$, $SF_6$ or the like (refer to JP2002-25027A) and a method employing a wet etching where strong alkaline solution such as hydrazine solution, potassium hydroxide solution or the like (JP2001-55570A). Even in case that either one of the etching methods is used, an etching rate of polyimide coming in contact with SUS304 varies according to respective lots of SUS304 to be used. For this reason, in order to conduct polyimide etching completely, it is necessary to set an etching time to be long so as to meet a case that the etching rate is slow. In such a polyimide etching over a long time, a phenomenon where polyimide is etched excessively over a predetermined size, so-called over-etching phenomenon is observed. Therefore, not only a problem that the above-described long time etching is required occurs but also there occurs a problem in etching shape.

As an example where wet-etchable polyimide base resin is used, a metal laminate such as described in JP2002-240193A publication or JP2002-245609A publication has been proposed. According to the proposals, there is described that the metal laminate improves a productivity and it is effective for cost reduction, because a wet etching rate of polyimide is fast. In these patent applications, however, there is not any clear description about an oxide film of metal, and there is a problem that according to circumstances, an etching rate of polyimide becomes slow and the so-called over-etching phenomenon is caused, which results in deterioration of a shape and reduction in productivity. Further, since many wet-etchable polyimides have an average thermal expansion coefficient of 25 ppm/° C. or more, a difference in thermal expansion coefficient between the wet-etchable polyimide and metal material such as stainless steel or the like is large and the polyimide is poor in warp or size stability, it is actually difficult to use such a polyimide as suspension material.

SUMMARY OF THE INVENTION

In view of the above-described problems, an object of the present invention is to provide a metal laminate where an etching rate of an insulating layer can be improved stably after metal has been etched, and to provide an etching shape can be kept constant, and a metal laminate which allows variations in etching rate to be cancelled, and an etching method of the same.

As results of an eager studying, the present inventors noticed a surface oxide film of metal existing in a lamination interface between an insulating layer and a metal in a metal laminate comprising the metal and the insulating layer, and found that the thickness of the surface oxide film influences an etching rate or variations therein and therefore a shape of etching or the like. And the present inventors have completed the present invention by making the above-described influence clear.

That is, according to the present invention, there are provided:

1) A metal laminate which includes a layer obtained by laminating a metal layer and an insulating layer, where the insulating layer is subjected to an etching processing, wherein, in a surface of the metal layer which is positioned at a such a side that the metal layer comes in contact with the insulating layer, respective concentrations of main metal element and oxygen element constituting the metal layer are measured from the surface of the metal layer towards inside of the metal layer in a time-elapsing manner according to AES (Auger electron spectroscopy) and a value of the thickness of a metal oxide film of the surface of the metal layer measured at a time when atomic concentrations of the main metal element and the oxygen element constituting the metal layer become equal to each other is in a range of at least 0 Å to less than 50 Å.

2) The metal laminate according to the above 1), where the metal layer contains at least one of elements selected from the group consisting of iron element, copper element, aluminum element, nickel element and molybdenum.

3) The metal laminate according to the above 1), where the insulating layer comprises resin selected from the group consisting of polyimide, polyamide, and polyamideimide.

4) The metal laminate according to the above 1), where constitution of the metal laminate is a double-sided metal laminate comprising a metal layer/a polyimide layer/a SUS layer selected from the group consisting of copper, SUS and copper alloy.

5) The metal laminate according to the above 4), where the polyimide comprises constitution of thermoplastic polyimide/non-thermoplastic polyimide/thermoplastic polyimide.

6) A flexure used for a suspension for a hard disc, which is manufactured from a metal laminate according to any one of the above 1) to 5).

7) A method for manufacturing a metal laminate which includes a layer obtained by laminating a metal layer and an insulating layer to each other and where the insulating layer is subjected to an etching processing, wherein, when an insulating layer is laminated on metal, in a surface of the metal layer which is positioned on such a side that the metal layer comes in contact with the insulating layer, respective concentrations of main metal element and oxygen element constituting the metal layer are measured from the surface of the metal layer towards inside of the metal layer in a time-elapsing manner according to AES (Auger electron spectroscopy) and metal meeting the condition that a value of the thickness of a metal oxide film of the surface of the metal layer measured at a time when atomic concentrations of the main metal element and the oxygen element constituting the metal layer become equal to each other is in a range of at least 0 Å to less than 50 Å is selected and used.

8) A plasma etching method according to any one of the above 1) to 5), where a metal laminate is used as a material to be etched.

9) A wet etching method of a metal laminate wherein a metal laminate according to in any one of the above 1) to 5) is etched with alkaline solution.

According to the above, an etching time of polyimide in a polyimide metal laminate can be calculated and a flexure with a high productivity used for a suspension for a hard disc drive can be provided.

DESCRIPTION OF PREFERRED EMBODIMENT

The present invention will be explained below in detail.

The present invention relates to a metal laminate which includes a layer obtained by laminating a metal layer and an insulating layer, where the insulating layer is subjected to an etching processing, wherein, in a surface of the metal layer which is positioned at such a side that the metal layer comes in contact with the insulating layer, respective concentrations of main metal element and oxygen element constituting the metal layer are measured from the surface of the metal layer towards inside of the metal layer in a time-elapsing manner according to AES (Auger electron spectroscopy) and a value of the thickness of a metal oxide film of the surface of the metal layer measured at a time when atomic concentrations of the main metal element and the oxygen element constituting the metal layer become equal to each other is in a range of at least 0 Å to less than 50 Å.

The AES means Auger electron spectroscopy, and it can measure the kind and the amount of element existing on a solid surface by measuring Auger electrons generated when the electron beam is irradiated. In the present invention, when atom concentrations of oxygen element and main metal element constituting metal have become equal to each other, a thickness from the metal surface inwards is measured as a thickness of a surface oxide film of the metal by using a TEM (transmission electron microscope) or a SEM (scanning electron microscope) or the like. In case that SUS304 is used as the metal, elements detected by AES are oxygen element (O) and iron element (Fe).

In the present invention, it is important that the thickness of surface oxide of metal is at least Q Å and less than 50 Å. The thickness is preferably at least 25 Å and 50 Å, and further preferably 30 Å and less than 40 Å. The thinner the surface oxide is, the more preferable it is, because the etching rate becomes faster. However, when the surface oxide is thinner than 25 Å, a heat resistance thereof deteriorates, and when the surface oxide is exposed to a high temperature of 200° C. or higher, a discoloration may occur, to which attention should be paid. Further, since the etching rate of the insulating layer varies due to variations in thickness of the surface oxide, it is preferable that the thickness of the surface oxide is constant. On the other hand, when the thickness of the surface oxide is 50 Å or more, such a drawback occurs that the etching rate of the insulating layer becomes considerably slow and a productivity is much deteriorated, which is undesirable. Further, since the etching rate is slow the so-called over-etching phenomenon is easy to occur, which makes it impossible to conduct micro-fabrication, for example, fabrication of a line-shape with a width of 30 µm. As a result, it becomes difficult to meet size reduction of a suspension required for micro-fabrication, which is not desirable.

The thickness of the oxide film observed when the atom concentrations of the oxide element and the main metal element detected according to the time elapsing by AES become equal to each other can be observed by TEM, SEM or the like. The TEM is a transmission electron microscope, which allows observation of a surface and a section of a superfine portion, and analysis of a structure and element of the portion, and specifically, which irradiates an electron beam on a thinned sample to image electrons transmitted through the sample thereby allowing observation. The SEM is a scanning electron microscope.

The metal in the metal laminate of the present invention is preferably metal including at least one selected from the group consisting of iron element, copper element, aluminum element, nickel element and molybdenum element, and the metal is specifically one selected from the group consisting of copper, nickel, aluminum, stainless steel or alloy thereof. The metal is preferably stainless steel and further preferably SUS304.

In case that SUS304 is used as the metal, control of a surface oxide film of SUS304 can be performed by adjusting a temperature and a time in a tension-anneal treatment where a material is left as it is for a constant time in nitrogen gas atmosphere including hydrogen gas under a high temperature while a pulling tension is applied to the material in order to conduct strain removal from the material rolled to be thin. Since the thickness of the surface oxide film is increased/decreased according to oxidation/reduction reaction during the tension-anneal treatment, it is preferable that a treatment at a high temperature and for a long time is conducted in order to thin the thickness. Preferable conditions of the tension-anneal treatment include a temperature of 1000° C. to 1200° C. and a time of 10 minutes to 20 minutes.

In the present invention, the thickness of the metal is preferably 2 to 150 µm, and more preferably 10 to 100 µm.

As the insulating layer in the metal laminate of the present invention, specifically, for example, a resin selected from the group consisting of polyimide, polyamide, polyamideimide or the like is given. The insulating layer is preferably polyimide, and it is further preferable that the polyimide has a constitution of thermoplastic polyimide/non-thermoplastic polyimide/thermoplastic polyimide.

It is preferable that the insulating layer in the metal laminate of the present invention is a single layer structure of thermoplastic resin and non-thermoplastic resin, or a multi-layer structure constituted by a combination thereof.

Further, as the insulating layer in the metal laminate of the present invention, it is preferable that an average thermal expansion coefficient thereof is at least 10 ppm/° C. and at most 25 ppm/° C. The average thermal expansion coefficient is more preferably at least 15 ppm/° C. and at most 20 ppm/° C. When the average thermal expansion coefficient is in this range, an average linear expansion coefficient of the insulating layer is close to that of metal and a warp of the metal laminate is hard to occur, which is desirable.

The thermoplastic resin used in the insulating layer in the metal laminate of the present invention is not limited to a specific one. However, it is preferable that the thermoplastic resin is thermoplastic polyimide obtained by polymerizing at least one diamine selected from the group consisting of 1,3-bis (3-aminophenoxy) benzene, 1,3-bis (3-(3-aminophenoxy) phenoxy) benzene, 4,4'-bis (3-aminophenoxy) biphenyl and 3,3'-diaminobenzophenone, and at least one tetra-carboxylic dianhydride selected from the group consisting of pyromellitic dianhydride, 3, 3', 4, 4'-biphenyl-tetra-carbocvclic dianhydride, 3, 3', 4, 4'-benzophenone tetra-carbocyclic dianhydride. or 3, 3', 4, 4'-diphenyl-ether-tetra-carbocyclic dianhydride.

In case that the above-described thermoplastic polyimide is produced, it is preferable that are action mole ratio of diamine component and tetra-carbocylic dianhydride is in a rang of 0.75 to 1.25.

As specific examples of the constitution of the metal laminate of the present invention, there is a single-sided metal laminate where an insulating layer has been laminated on a metal plate, or a double-sided metal laminate where an insulating layer and a metal plate are constituted on another metal plate, and a preferable metal laminate is a double-sided metal laminate comprising a metal layer/a polyimide layer/a SUS layer selected from the group consisting of copper, SUS and copper alloy.

When polyimide has been used as the insulating layer of the metal laminate, there is a wet etching process mainly using hydrazine or a plasma etching process as a polyimide etching process. Both the processes can be used, because there is not a significant difference between the both regarding a polyimide etching rate.

The present invention also provides a plasma etching process where the metal laminate is a material to be etched or a wet etching process of a metal laminate where the metal laminate is etched with alkaline aqueous solution.

In order to remove the insulating layer of the metal laminate by the plasma etching process, it is preferable that a plasma machining apparatus provided with a cathode electrode, an anode electrode and a plasma gas introducing pipe. As the plasma machining apparatus, for example, a plasma machining apparatus disclosed in JP2000-293966A publication can be used. As conditions of the plasma etching, the pressure of etching gas is preferably in a range of 3 to 50 Pa. The component of the etching gas comprises oxygen which is a main component and $SF_6$ added thereto at a percentage of 10 to 20%. Further, the etching gas may be added with Ar at a percentage of 5 to 15%. Furthermore, instead of $SF_6$, $NF_3$, $CF_4$, $CHF_3$ or the like may be used. The etching is preferably conducted at a flow rate of the etching gas of about 30 to 3000 sccm. The etching is preferably conducted with a power of 0.5 to 5 W. In case that polyimide is used as the insulating layer of the metal laminate, the etching rate of polyimide is set to a value obtained by dividing a weight of the insulating layer by a time required for removing the insulating layer completely when the etching has been conducted under the above-described conditions.

In case that the insulating layer is removed by the wet etching process, strong alkaline aqueous solution can be used. As the strong alkaline aqueous solution, aqueous solution of potassium hydroxide with 2 to 50 wt % can preferably be used. Specifically, alkali-amine type etchant disclosed in JP10-97081A publication can be used. It is preferable that etchant is heated to be used, and it is further preferable that etchant is heated to a temperature of about 60 to 90° C.

The etching rate in case that polyimide is used as the insulating layer of the metal laminate is set to a value obtained by dividing a weight of the insulating layer by a time required for performing etching with aqueous solution of potassium hydroxide with 30 wt % heated to 80° C. to remove the insulating layer completely.

In case that a plasma etching of the insulating layer is performed using a metal laminate where the thickness of an oxide film of a metal is in a range of at least 0 Å and less than 50 Å, the etching rate is at least 5 mg/min, which is desirable. When wet etching is conducted, the etching rate becomes at least 2 mg/sec, which is desirable. When the etching rate is smaller than the value, the so-called over-etching phenomenon is observed, so that there will occur such a drawback that a micro-fabrication can not be substantially carried out.

For the method for manufacturing a metal laminate of the present invention, as one example of a case of using polyimide in an insulating layer and using SUS304 and copper alloy as metal, there are a method which sequentially applying and curing thermoplastic polyimide/non-thermoplastic polyimide/thermoplastic polyimide to a copper alloy foil and laminating SUS304 thereto by thermo-compression bonding and a method which uses a double-sided adhesive sheet obtained by applying thermoplastic polyimide to both surfaces of a non-thermoplastic polyimide film to laminate respective copper alloy and SUS304 thereto by thermo-compression bonding. Incidentally, as the thermo-compression bonding method, there are a thermal press, a laminating and the like.

In one of more specific manufacturing methods, there is the following method. One portion of a thin strip of SUS304 which is metal is taken out from a roll thereof and its thickness is measured using AES. A thin strip whose oxide film thickness is in a range of at least 0 Å and less than 50 Å is selected and used. Next, varnish including polyamic acid which is precursor of thermoplastic polyimide is applied on a copper alloy and drying/curing is conducted at a temperature of about 60 to 400° C. to form a thermoplastic polyimide layer, varnish including polyamic acid which is precursor of non-thermoplastic polyimide is applied on the thermoplastic polyimide layer and drying/curing is conducted at a temperature of 60 to 400° C. to form another thermoplastic polyimide layer, varnish including polyamic acid which is precursor of thermoplastic polyimide is applied on the another thermoplastic polyimide and drying/curing is conducted at a temperature of 60 to 400° C. to form still another thermoplastic polyimide layer, and a thermal compression bonding of SUS304 is then conducted on a surface of thermoplastic polyimide at a temperature of 150 to 600° C.; or varnish including polyamic acid which is precursor of thermoplastic polyimide is applied on both surfaces of the non-thermoplastic polyimide film and drying/curing is conducted at a temperature of 60 to 400° C. to form a double-sided thermoplastic polyimide bonding sheet and thermal compression bondings of copper alloy and SUS304 are conducted on the both surfaces of the sheet at a temperature of 150 to 600° C.

A base film of a bonding sheet which can be used is not limited to a specific one, but it is possible to use a non-thermoplastic polyimide film commercially available. As specific examples, there are UPILEX (trademark) Series of polyimide film manufactured by UBE INDUSTRIES, LTD, APICAL (trademark) Series of polyimide film manufactured by KANEKA, LTD, KAPTON (trademark) Series of polyimide film manufactured by DU PONT-TORAY CO., LTD, Aramica Series of polyimide film manufactured by TORAY INDUSTRIES, INC. and the like.

In the present invention, the thickness of the insulating layer is preferably in a range of 5 to 250 μm, and more preferably in a range of 8 to 50 μm. Preferable thicknesses of thermoplastic polyimide/non-thermoplastic polyimide/thermoplastic polyimide which are used as the insulating layer are 0.5 μm to 10 μm/7.5 μm to 75 μm/0.5 μm to 10 μm, respectively.

In the metal laminate provided by the present invention, when SUS304 is used as metal, a polyimide etching rate after SUS304 has been etched can be estimated based on the thickness of a surface oxide film of SUS304. Therefore, a polyimide etching time can be can be calculated in advance so that the efficiency of a polyimide etching step can be improved.

According to the present invention, a metal laminate excellent in polyimide etching property can be obtained. For this reason, the polyimide laminate of the present invention is suitably used as a suspension particularly used in a hard disc.

A manufacturing method of a suspension for a hard disc can generally be conducted in the following manner.

First, a photosensitive resin is formed on a metal surface of the metal laminate plate of the present invention for forming a circuit by application or pasting. A mask on which a desired pattern image has been drawn is brought in close contact with the photosensitive resin and microwaves with a wavelength where the photosensitive resin has sensitivity are irradiated on the photosensitive resin. A non-exposed portion of the photosensitive resin is eluted with predetermined developer to from a desired circuit image on the metal. After exposed metal has been solved dissolved by dipping the metal laminate in this state in solution which can solve dissolve metal such as ferric chloride or the like or spaying the solution on the substrate, the photosensitive resin is released by a predetermined releasing agent to form the circuit.

Next, similarly, a mask on which a desired pattern image has been drawn is brought in close contact with the circuit formed on the metal surface so that patterning is conducted by a wet etching process or a plasma etching process.

After patterning has been completed, a suspension is fabricated by joining the metal laminate to a stainless work product called "a load beam" by a laser welding or the like.

EXAMPLES

The present invention will be further explained below with reference to Examples.

A thickness of a surface oxide film of metal (SUS304), an insulating layer (polyimide) etching rate and an average thermal expansion coefficient were measured by the following methods.

(1) Surface Oxide Film Measuring Method

Using an apparatus of MICROLAB310F manufactured by VG Inc. as AES (Auger Electron Spectroscopy), ion etching was conducted for a predetermined time under the conditions of an acceleration voltage of 5,00 KV, a current of $9.01 \times 10^{-30}$ A, a pressure of $2.1 \times 10^{-8}$ Pa to analyze the kinds and the amounts of elements. A decrease of a film thickness due to the ion etching was observed and length-measured by TEM. Thereby, the thickness of the surface oxide film could be obtained when atomic concentrations of metal elements and oxygen element became equal to each other.

(2) Polyimide Etching Rate (A Case of Plasma-Etching)

After SUS304 side of a double-sided metal laminate was removed using ferric chloride solution, a plasma etching processing was conducted. The single-sided metal laminate obtained by removing SUS304 was thrown in a chamber set to such conditions that $O_2$, $SF_6$ and Ar gas flow rates were respectively 0.89 L/min, 0.19 L/min and 0.07 L/min, a pressure at this time was 26.7 Pa, and a discharge output was 2.3 KW, and it was treated for 5 min. Weights of the single-sided metal laminate before and after the plasma etching were measured by an electronic force balance, and an etching rate was calculated.

(3) Polyimide Etching Rate (A Case of Wet-Etching)

After SUS304 side of a double-sided metal laminate was removed using ferric chloride solution, a wet etching was conducted. As etchant, TPE-3000 (trade name) manufactured by TORAY ENGINEERING CO., LTD. was used. The etchant was heated to a temperature of 80° C. and stirred by a magnetic stirrer, and single-sided metal laminate obtained by removing SUS304 was thrown in the etchant and treated for one minute. Weights of the single-sided metal laminate before and after the plasma etching were measured by an electronic force balance, and an etching rate was calculated.

(4) Thermal Expansion Coefficient

Measurement was conducted, using a thermo-mechanical analyzer TMA4000 manufactured by MAC SCIENCE COMPANY, under the condition that a tensile load was 3 g, a temperature rising speed was 10° C./min, a temperature range was a range of 100° C. to 250° C., and thermal expansion coefficients were calculated.

Further, abbreviations of solvent, acidic anhydride and diamine are as follows:

DMAc: N,N'-dimethylacet-amide
NMP: N-methyl-2-pyrrolidone
PPD: p-phenylenediamine
ODA: 4,4'-diamino diphenyl ether
m-BP: 4,4'-bis(3-aminophenoxy)biphenyl
APB: 1,3-bis(3-aminophenoxy)benzene
APPB: 1,3-bis(3-(3-aminophenoxy)phenoxy)benzene
DABP: 3,3'-diamino benzophenone
BPDA: 3,3',4,4'-biphenyl tetra-carboxylic dianhydride
BTDA: 3,3',4,4'-benzophenone tetra-carboxylic dianhydride
PMDA: pyromellitic dianhydride Synthetic Example 1

<Synthesis of Thermoplastic Polyimide Precursor>

20 moles of APB as a diamine component and 19.4 moles of BTDA as tetra-carboxylic dianhydride component were weighed and they were mixed in solvent of N,N'-dimethylacet-amide. Mixing temperature and mixing time were 23° C. and 8 hours. Further, the mixing was conducted in a state that a solid component concentration at a start time of the mixing was 17 weight percent. The viscosity of polyamic acid varnish obtained was 400 cps at a temperature of 25° C. and was suitable for application.

Synthetic Example 2

<Synthesis of Thermoplastic Polyimide Precursor>

20 moles of DABP as a diamine component and 19.4 moles of BTDA as tetra-carboxylic dianhydride component were weighed and they were mixed in solvent of N,N'-dimethylacet-amide. Mixing temperature and mixing time were 23° C. and 8 hours. Further, the mixing was conducted in a state that a solid component concentration at a start time of the mixing was 17 weight percent. The viscosity of polyamic acid varnish obtained was 300 cps at a temperature of 25° C. and was suitable for application.

Synthetic Example 3

<Synthesis of Thermoplastic Polyimide Precursor>

20 moles of APB as a diamine component and 19.4 moles of BPDA as tetra-carboxylic dianhydride component were weighed and they were mixed in solvent of N,N'-dimethylacet-amide. Mixing temperature and mixing time were 23° C. and 8 hours. Further, the mixing was conducted in a state that a solid component concentration at a start time of the mixing was 17 weight percent. The viscosity of polyamic acid varnish obtained was 400 cps at a temperature of 25° C. and was suitable for application.

Synthetic Example 4

<Synthesis of Thermoplastic Polyimide Precursor>

20 moles of m-BP as a diamine component and 9.8 moles of each of BPDA and PMDA as tetra-carboxylic dianhydride component were weighed and they were mixed in solvent of N-methyl-2-pyrrolidone. Mixing temperature and mixing time were 23° C. and 8 hours. Further, the mixing was conducted in a state that a solid component concentration at a start time of the mixing was 15 weight percent. The viscosity of polyamic acid varnish obtained was 500 cps at a temperature of 25° C. and was suitable for application.

Synthetic Example 5

<Synthesis of Thermoplastic Polyimide Precursor>

20 moles of APPB as a diamine component and 19.4 moles of BTDA as a tetra-carboxylic dianhydride component were weighed and they were mixed in solvent of N,N'-dimethylacet-amide. Mixing temperature and mixing time were 23° C. and 8 hours. Further, the mixing was conducted in a state that a solid component concentration at a start time of the mixing was 17 weight percent. The viscosity of polyamic acid varnish obtained was 400 cps at a temperature of 25° C. and was suitable for application.

Synthetic Example 6

<Synthesis of Non-Thermoplastic Polyimide Precursor>

7.7 moles of PPD, 1.15 moles of ODA and 1.15 moles of m-BP as a diamine component were weighed. 5.4 moles of BPDA and 4.45 moles of PMDA as tetra-carboxylic dianhydride component were weighed. These components were dissolved and mixed in mixed solvent of N,N'-dimethylacet-amide and N-methyl-2-pyrrolidone. The solvent ratio of the former to the latter was 23 weight percent: 77 weight percent. As a result of measurement conducted by an E type viscometer, the viscosity of polyamic acid varnish obtained was 30000 cps at a temperature of 25° C. and was suitable for application.

Example 1

<Measurement of Thickness of Metal Oxide Film>

An oxide film thickness of a stainless steel foil (Trade Name: SUS304H-TA with thickness of 20 μm, manufactured by NIPPON STEEL CORPORATION) which was metal used for metal laminate was measured. The thickness was 30 Å and it was suitable for etching an insulating layer.

<Manufacture of Single-Sided Metal Laminate>

After a polyamic acid varnish of the synthetic example 2 as a thermoplastic polyimide layer was applied to a commercially available copper alloy foil (TradeName: C7025 (specially ordered brand) with thickness of 18 μm, manufactured by OLIN CORPORATION) and dried, and then, after a polyamic acid varnish of the synthetic example 6 as a non-thermoplastic polyimide layer was applied to the dried varnish and dried, a polyamic acid varnish of the synthetic example 1 was applied and dried to produce a single-sided metal laminate. A reverse roll coater was used for the application of the thermoplastic polyamic acid varnish and a die coater was used for the application of the non-thermoplastic polyamic acid varnish. The thickness of the polyimide layer after applied and dried was 13 μm. Incidentally, the maximum temperature during drying was 350° C.

<Implementation of Heat Press>

A stainless steel foil (Trade Name: SUS304H-TA with thickness of 20 μm, manufactured by NIPPON STEEL CORPORATION) was used as metal. A single-sided metal laminate whose polyimide face was superimposed with the SUS304H-TA foil was sandwiched between cushion materials (Trade Name: KINYO BOARD F200, manufactured by KINYOSHA CO., LTD), and a heating and compressing adhering operation was conducted for 30 minutes under the condition of 230° C. and 60 kg/cm$^2$ by a heating press machine to fabricate a polyimide metal laminate comprising five layers of SUS304H-TA/themoplastic polyimide/non-thermoplastic polyimide/thermoplastic polyimide/C7025.

<Evaluation of Polyimide Metal Laminate>

Using the polyimide metal laminate obtained, the surface oxide film thickness and the polyimide etching rate according to the plasma etching process were measured, as described above. As a result, the polyimide etching rate was 25 mg/min. A sectional configuration which did not include over-etching was obtained.

Example 2

<Manufacture of Double-Sided Adhesive Sheet>

Polyamic acid varnish of the synthetic example 1 as a non-thermoplastic polyimide layer was applied to both surfaces of a commercially available polyimide film (Trade Name: APICAL®12.5NPI with thickness of 12.5 μm, manufactured by KANEKA, LTD) and dried to produce a double-sided adhesive sheet. A reverse roll coater was used for the application of the thermoplastic polyamic acid varnish, and the thickness of the varnish after applied and dried was 18 μm. Incidentally, the maximum temperature during drying was 280° C.

<Measurement of Oxide Film Thickness>

An oxide film thickness of a stainless steel foil (Trade Name: SUS304H-TA with thickness of 20 μm, manufactured by NIPPON STEEL CORPORATION) which was used for a metal laminate was measured. The thickness was 40 Å and it was suitable for etching an insulating layer.

<Implementation of Heat Press>

A copper alloy foil (Trade Name: C7025 (specially ordered brand) with thickness of 18 μm, manufactured by OLIN CORPORATION) and a stainless steel foil (Trade Name: SUS304H-TA with thickness of 20 μm, manufactured by NIPPON STEEL CORPORATION) were used as metal. A double-sided adhesive sheet whose both sides were respectively superimposed with C7025 and SUS304H-TA foils was sandwiched between cushion materials (Trade Name: KINYO BOARD F200 manufactured by KIN-YOSHA CO., LTD), and a heating and compressing adhering operation was conducted for 60 minutes under the condition of 250° C. and 70 kg/cm$^2$ by a heating press machine to fabricate a polyimide metal laminate comprising five layers of SUS304H-TA/themoplastic polyimide/non-thermoplastic polyimide/thermoplastic polyimide/C7025.

<Evaluation of Polyimide Metal Laminate>

Using the polyimide metal laminate obtained, the surface oxide film thickness and the polyimide etching rate according to the plasma etching process were measured, as described above. As a result, the surface oxide film thickness of SUS304H-TA coming in contact with polyimide was 40 Å. As a result of plasma etching conducted from the SUS304 side, the polyimide etching rate was 15 mg/min. A configuration which did not have any over-etching was obtained.

Example 3

<Manufacture of Double-Sided Adhesive Sheet>

A double-side adhesive sheet was manufactured in the same manner as that in Example 2 except that a thermoplastic polyimide precursor of the synthetic example 3 was used instead of the thermoplastic polyimide precursor of the synthetic example 1.

<Measurement of Oxide Film Thickness>

An oxide film thickness of a stainless steel foil (Trade Name: SUS304H-TA with thickness of 20 µm, manufactured by NIPPON STEEL CORPORATION) which was used for a metal laminate was measured. The thickness was 35 Å and it was suitable for etching an insulating layer.

<Implementation of Heat Press>

A polyimide metal laminate comprising five layers of SUS304H-TA/themoplastic polyimide/non-thermoplastic polyimide/thermoplastic polyimide/C7025 was produced in the same manner as that in Example 2 except that a heating and compressing adhering operation was conducted for 30 minutes under the conditions of 270° C. and 50 kg/cm$^2$ by a heating press machine.

<Evaluation of Polyimide Metal Laminate>

Using the polyimide metal laminate obtained, plasma etching was conducted from the SUS304 side and measurement was carried out, as described above. As a result, the polyimide etching rate was 18 mg/min. A configuration which did not have any over-etching was obtained.

Example 4

<Manufacture of Double-Sided Adhesive Sheet>

A double-side adhesive sheet was manufactured in the same manner as that in Example 2 except that a thermoplastic polyimide precursor of the synthetic example 4 was used instead of the thermoplastic polyimide precursor of the synthetic example 1.

<Measurement of Oxide Film Thickness>

An oxide film thickness of a stainless steel foil (Trade Name: SUS304H-TA with thickness of 20 µm, manufactured by NIPPON STEEL CORPORATION) which was used for a metal laminate was measured. The thickness was 47 Å and it was suitable for etching an insulating layer.

<Implementation of Heat Press>

A polyimide metal laminate comprising five layers of SUS304H-TA/themoplastic polyimide/non-thermoplastic polyimide/thermoplastic polyimide/C7025 was produced in the same manner as that in Example 2 except that a heating and compressing adhering operation was conducted for 60 minutes under the conditions of 290° C. and 50 kg/cm$^2$ by a heating press machine.

<Evaluation of Polyimide Metal Laminate>

Using the polyimide metal laminate obtained, plasma etching was conducted from the SUS304 side and measurement of the polyimide etching rate was carried out, as described above. As a result, the polyimide etching rate was 7 mg/min. A sectional configuration which over-etching was reduced was obtained.

Example 5

<Manufacture of Double-Sided Adhesive Sheet>

A double-sided adhesive sheet was manufactured in the same manner as that in Example 2 except that a thermoplastic polyimide precursor of the synthetic example 5 was used instead of the thermoplastic polyimide precursor of the synthetic example 1.

<Measurement of Oxide Film Thickness>

An oxide film thickness of a stainless steel foil (Trade Name: SUS304H-TA with thickness of 20 µm, manufactured by NIPPON STEEL CORPORATION) which was used for a metal laminate was measured. The thickness was 450 Å and it was suitable for etching an insulating layer.

<Implementation of Heat Press>

A polyimide metal laminate comprising five layers of SUS304H-TA/themoplastic polyimide/non-thermoplastic polyimide/thermoplastic polyimide/C7025 was produced in the same manner as that in Example 2 except that a heating and compressing adhering operation was conducted for 30 minutes under the conditions of 230° C. and 50 kg/cm$^2$ by a heating press machine.

<Evaluation of Polyimide Metal Laminate>

Using the polyimide metal laminate obtained, plasma etching was conducted from the SUS304 side and the polyimide etching rate was measured, as described above. As a result, the polyimide etching rate was 10 mg/min.

Example 6

<Manufacture of Single-Sided Metal Laminate>

After a polyamic acid varnish of the synthetic example 3 as a thermoplastic polyimide layer was applied to a commercially available copper alloy foil (Trade Name: C7025 with thickness of 18 µm, manufactured by OLIN CORPORATION) and dried, and then, after a polyamic acid varnish of the synthetic example 4 as a non-thermoplastic polyimide layer was applied to the dried varnish and dried, a polyamic acid varnish of the synthetic example 1 was applied and dried to produce a single-sided metal laminate. A reverse roll coater was used for the application of the thermoplastic polyamic acid varnish and a die coater was used for the application of the non-thermoplastic polyamic acid varnish. The thickness of the polyimide layer after applied and dried was 13 µm. Incidentally, the maximum temperature during drying was 350° C.

<Measurement of Oxide Film Thickness>

An oxide film thickness of a stainless steel foil (Trade Name: SUS304H-TA with thickness of 20 μm, manufactured by NIPPON STEEL CORPORATION) which was used for a metal laminate was measured. The thickness was 32 Å and it was suitable for etching an insulating layer.

<Implementation of Heat Press>

As a stainless steel foil, Trade Name: SUS304H-TA with thickness of 20 μm, manufactured by NIPPON STEEL CORPORATION was used. A single-sided metal laminate whose polyimide face was superimposed with the SUS304H-TA foil was sandwiched between cushion materials (Trade Name: KINYO BOARD F200, manufactured by KINYOSHA CO., LTD), and a heating and compressing adhering operation was conducted for 30 minutes under the conditions of 230° C. and 60 kg/cm$^2$ by a heating press machine to fabricate a polyimide metal laminate comprising five layers of SUS304H-TA/themoplastic polyimide/non-thermoplastic polyimide/thermoplastic polyimide/C7025.

<Evaluation of Polyimide Metal Laminate>

Using the polyimide metal laminate obtained, wet etching was conducted from the SUS304 side and the polyimide etching rate and the thermal expansion coefficient were measured, as described above. As a result, the polyimide etching rate was 3.4 mg/min and the thermal expansion coefficient was 20 ppm/° C. A sectional configuration which had reduced over-etching was obtained.

Example 7

<Manufacture of Double-Sided Adhesive Sheet>

Polyamic acid varnish of the synthetic example 2 as a non-thermoplastic polyimide layer was applied to both surfaces of a commercially available polyimide film (Trade Name: APICAL 12.5NPI with thickness of 12.5 μm, manufactured by KANEKA, LTD) and dried to produce a double-sided adhesive sheet. A reverse roll coater was used for the application of the thermoplastic polyamic acid varnish, and the thickness of the varnish after applied and dried was 18 μm. Incidentally, the maximum temperature during the drying was 260° C.

<Measurement of Oxide Film Thickness>

An oxide film thickness of a stainless steel foil (Trade Name: SUS304H-TA with thickness of 20 μm, manufactured by NIPPON STEEL CORPORATION) which was used for a metal laminate was measured. The thickness was 45 Å and it was suitable for etching an insulating layer.

<Implementation of Heat Press>

A copper alloy foil (Trade Name: C7025 (specially ordered brand) with thickness of 18 μm, manufactured by OLIN CORPORATION) and a stainless steel foil (Trade Name: SUS304H-TA with thickness of 20 μm, manufactured by NIPPON STEEL CORPORATION) were used as metal. A double-sided adhesive sheet whose both sides were respectively superimposed with C7025 and SUS304H-TA foils was sandwiched between cushion materials (Trade Name: KINYO BOARD F200 manufactured by KINYOSHA CO., LTD), and a heating and compressing adhering operation was conducted for 60 minutes under the condition of 250° C. and 70 kg/cm$^2$ by a heating press machine to fabricate a polyimide metal laminate comprising five layers of SUS304H-TA/themoplastic polyimide/non-thermoplastic polyimide/thermoplastic polyimide/C7025.

<Evaluation of Polyimide Metal Laminate>

Using the polyimide metal laminate obtained, wet etching was conducted from the SUS304 side and the polyimide etching rate and the thermal expansion coefficient were measured, as described above. As a result, the polyimide etching rate was 5.7 mg/min and the thermal expansion coefficient was 22 ppm/° C.

Comparative Example 1

<Manufacture of Double-Sided Adhesive Sheet>

Polyamic acid varnish of the synthetic example 2 as a non-thermoplastic polyimide layer was applied to both surfaces of a commercially available polyimide film (Trade Name: APICAL 12.5NPI with thickness of 12.5 μm, manufactured by KANEGAFUCHI KAGAKU, LTD) and dried to produce a double-sided adhesive sheet. A reverse roll coater was used for the application of the thermoplastic polyamic acid varnish, and the thickness of the varnish after applied and dried was 18 μm. Incidentally, the maximum temperature during drying was 260° C.

<Measurement of Oxide Film Thickness>

An oxide film thickness of a stainless steel foil (Trade Name: SUS 304H-TA with thickness of 20 μm, manufactured by NIPPON STEEL CORPORATION) which was used for a metal laminate was measured. The thickness was 82 Å and the surface oxide film was thick.

<Implementation of Heat Press>

A copper alloy foil (Trade Name: C7025 (specially ordered brand) with thickness of 18 μm, manufactured by OLIN CORPORATION) and a stainless steel foil (Trade Name: SUS304H-TA with thickness of 20 μm, manufactured by NIPPON STEEL CORPORATION) were used as metal. A double-sided adhesive sheet whose both sides were respectively superimposed with C7025 and SUS304H-TA foils was sandwiched between cushion materials (Trade Name: KINYO BOARD F200 manufactured by KINYOSHA CO., LTD), and a heating and compressing adhering operation was conducted for 60 minutes under the condition of 250° C. and 70 kg/cm$^2$ by a heating press machine to fabricate a polyimide metal laminate comprising five layers of SUS304H-TA/themoplastic polyimide/non-thermoplastic polyimide/thermoplastic polyimide/C7025.

<Evaluation of Polyimide Metal Laminate>

Using the polyimide metal laminate obtained, wet etching was conducted from the SUS304 side and the polyimide etching rate and the thermal expansion coefficient were measured, as described above. As a result, the polyimide etching rate was 1.2 mg/min and the thermal expansion coefficient was 22 ppm/° C.

There occurred no warp in the base plate and a drawback about appearance was not found. However, since the etching rate was slow, a sectional configuration after etching became trapezoidal and over-etching occurred so that a desired shape can not be obtained.

INDUSTRIAL APPLICABILITY

As a metal laminate of the present invention, a polyimide metal laminate having a constitution of copper alloy/polyimide/SUS304 is provided as one example. In the case, the metal laminate is a polyimide metal laminate where a polyimide etching rate after SUS304 has been etched can be estimated by measuring a surface oxide film of SUS304 existing in a lamination interface between polyimide and SUS304. For this reason, an etching time of polyimide in the polyimide metal laminate can be calculated and a flexure used in a suspension of a hard disc drive having a high productivity can be provided.

The invention claimed is:

1. A metal laminate comprising a metal layer having a metal oxide film laminated to an insulating layer, where the insulating layer is to be subjected to an etching processing to form a pattern, wherein, in a surface of the metal layer which is in contact with the insulating layer, respective concentrations of main metal element and oxygen element constituting the metal layer are measured from the surface of the metal layer towards the inside of the metal layer in a time-elapsing manner according to AES (Auger electron spectroscopy) and the thickness of a metal oxide film of the surface of the metal layer measured at a depth where atomic concentrations of the main metal element and the oxygen element constituting the metal layer are equal to each other is at least 25 Å and less than 50 Å.

2. The metal laminate according to claim 1, wherein the main metal element is selected from the group consisting of iron element, copper element, aluminum element, nickel element and molybdenum element.

3. The metal laminate according to claim 1, wherein the insulating layer is a resin selected from the group consisting of polyimide, polyamide, polyamideimide.

4. The metal laminate according to claim 1, wherein the metal laminate is a double-sided metal laminate comprising a SUS layer/a polyimide insulating layer/a metal layer selected from the group consisting of copper, SUS and copper alloy, both of said SUS layer and said metal layer having the metal oxide film, and wherein both the respective concentrations of the iron and oxygen in the SUS layer and the main metal and oxygen of the metal layer are measured according to AES and the depths where atomic concentrations of the iron and the oxygen of the SUS layer and the main metal and oxygen of the metal layer are equal to each other are both at least 25 Å less than 50Å.

5. The metal laminate according to claim 4, wherein the polyimide layer comprises a thermoplastic polyimide layer, a non-thermoplastic polyimide layer and a thermoplastic polyimide layer in this order.

6. A flexure for a suspension for a hard disc, manufactured from a metal laminate according to claim 1 wherein the metal laminate comprises the pattern etched insulating layer.

7. A flexure for a suspension for a hard disc, manufactured from a metal laminate according to claim 2 wherein the metal laminate comprises the pattern etched insulating layer.

8. A flexure for a suspension for a hard disc, manufactured from a metal laminate according to claim 3 wherein the metal laminate comprises the pattern etched insulating layer.

9. A flexure for a suspension for a hard disc, manufactured from a metal laminate according to claim 4 wherein the metal laminate comprises the pattern etched insulating layer.

10. A flexure for a suspension for a hard disc, manufactured from a metal laminate according to claim 5 wherein the metal laminate comprises the pattern etched insulating layer.

11. A plasma pattern etching method comprising etching a metal laminate according to claim 1.

12. A plasma pattern etching method comprising etching a metal laminate according to claim 2.

13. A plasma pattern etching method comprising etching a metal laminate according to claim 3.

14. A plasma pattern etching method comprising etching a metal laminate according to claim 4.

15. A plasma pattern etching method comprising etching a metal laminate according to claim 5.

16. A wet pattern etching method comprising etching a metal laminate according to claim 1 with alkaline aqueous solution.

17. A wet pattern etching method comprising etching a metal laminate according to claim 2 with alkaline aqueous solution.

18. A wet pattern etching method comprising etching a metal laminate according to claim 3 with alkaline aqueous solution.

19. A wet pattern etching pattern method comprising etching a metal laminate according to claim 4 with alkaline aqueous solution.

20. A wet pattern etching method comprising etching a metal laminate according to claim 5 with alkaline aqueous solution.

21. A method for manufacturing a metal laminate comprising laminating a metal layer to an insulating layer where the insulating layer is to be subjected to an etching processing, wherein the metal layer is selected so that the surface of the metal layer which is in contact with the insulating layer, has a thickness of a metal oxide film of the surface of the metal layer measured at a depth where atomic concentrations of the main metal element and the oxygen element constituting the metal layer are equal to each other is at least 25 Å and less than 50 Å, the respective concentrations of main metal element and oxygen element constituting the metal layer being measured from the surface of the metal layer towards the inside of the metal layer in a time-elapsing manner according to AES (Auger electron spectroscopy).

* * * * *